United States Patent
Kim

(10) Patent No.: US 9,201,110 B2
(45) Date of Patent: Dec. 1, 2015

(54) MULTI-CHANNEL LEAKAGE CURRENT MONITORING SYSTEM

(71) Applicant: LSIS CO., LTD., Anyang-Si, Gyeonggi-Do (KR)

(72) Inventor: Hyung Kyu Kim, Yongin-Si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 528 days.

(21) Appl. No.: 13/668,149

(22) Filed: Nov. 2, 2012

(65) Prior Publication Data

US 2013/0158902 A1    Jun. 20, 2013

(30) Foreign Application Priority Data

Dec. 19, 2011    (KR) .................. 10-2011-0137307

(51) Int. Cl.
G06F 19/00    (2011.01)
G01R 31/02    (2006.01)
G01R 31/327    (2006.01)

(52) U.S. Cl.
CPC .......... *G01R 31/025* (2013.01); *G01R 31/3277* (2013.01)

(58) Field of Classification Search
USPC .......................................................... 702/58
See application file for complete search history.

(56) References Cited

FOREIGN PATENT DOCUMENTS

| CN | 201229642 | 4/2009 |
|---|---|---|
| CN | 201853118 | 6/2011 |
| CN | 201886106 | 6/2011 |
| CN | 102142667 | 8/2011 |
| KR | 10-0669157 | 1/2007 |
| KR | 10-2010-0125809 | 12/2010 |
| WO | 2006/136520 | 12/2006 |

OTHER PUBLICATIONS

Muhammad Amin, Monitoring of Leakage Current for Composite Insulators and Electrical Devices, 2009 Advanced Study Center Co. Ltd., p. 75-89.*
The State Intellectual Property Office of the People's Republic of China Application Serial No. 201210444110.8, Office Action dated Sep. 10, 2014, 6 pages.
The State Intellectual Property Office of the People's Republic of China Application Serial No. 201210444110.8, Office Action dated May 19, 2015, 6 pages.
Korean Intellectual Property Office Application Serial No. 10-2011-0137307, Office Action dated Jan. 30, 2013, 4 pages.

* cited by examiner

*Primary Examiner* — Tung S Lau
(74) *Attorney, Agent, or Firm* — Lee, Hong, Degerman, Kang & Waimey

(57) ABSTRACT

Disclosed is a multi-channel leakage current monitoring system configured to monitor leakage currents transmitted to loads from a plurality of molded case circuit breakers (MC-CBs), and to transmit the leakage currents to a smart meter. The system comprises: a plurality of current transformers configured to measure power information data about loads connected to secondary side power lines of the MCCBs; and a multi-channel measuring unit (MCMU) configured to detect a leakage current by analyzing the power information data received from the current transformers. Under such a configuration, the size of the system can be reduced, and the number of communication lines can be minimized.

9 Claims, 4 Drawing Sheets

MULTI-CHANNEL LEAKAGE CURRENT MONITORING SYSTEM

CROSS-REFERENCE TO RELATED APPLICATION

Pursuant to 35 U.S.C. §119(a), this application claims the benefit of earlier filing date and right of priority to Korean Application No. 10-2011-0137307, filed on Dec. 19, 2011, the contents of which is incorporated by reference herein in its entirety.

BACKGROUND OF THE INVENTION

1. Field of the Invention

The present disclosure relates to a multi-channel leakage current monitoring system, and particularly, to a multi-channel leakage current monitoring system used in a power system.

2. Background of the Invention

Generally, a distribution board is provided with a plurality of molded case circuit breakers (MCCB), so that an input power can be distributed to each load.

FIG. 1 is a configuration view showing a distribution board system in accordance with the conventional art.

As shown in FIG. 1, input terminals of a main MCCB 101 are connected to power lines (three phases of R, S, T) in series, and output terminals of the main MCCB 101 are connected to a plurality of MCCBs 103 in parallel. Loads are connected to output terminals of the plurality of MCCBs 103, respectively.

In such a system, if one of the plurality of loads is shorted or has an over-load, the corresponding MCCB 103 is tripped. As a result, power applied from the main MCCB 101 is automatically broken.

However, since a single load is connected to a single MCCB 103 in such a system, the size of the system is drastically increased.

Furthermore, in the event of a leakage current occurring in such a system, there exists no information on the leakage current, such as the size or an occurrence time point. This may cause a difficulty in analyzing a cause of the leakage current.

SUMMARY OF THE INVENTION

Therefore, an aspect of the detailed description is to provide a multi-channel leakage current monitoring system capable of measuring leakage currents occurring from a plurality of power lines output to loads from a distribution board, and capable of having a reduced size.

Another aspect of the detailed description is to provide a multi-channel leakage current monitoring system capable of measuring a leakage current occurring from a plurality of power lines output to loads from a distribution board, and capable of checking specific data and information processed based on the data, through an upper device.

To achieve these and other advantages and in accordance with the purpose of this specification, as embodied and broadly described herein, there is provided a multi-channel leakage current monitoring system configured to monitor leakage currents transmitted to loads from a plurality of molded case circuit breakers (MCCBs), and to transmit the leakage currents to a smart meter, the system comprising: a plurality of current transformers configured to measure power information data about loads connected to secondary side power lines of the MCCBs; and a multi-channel measuring unit (MCMU) configured to detect a leakage current by analyzing the power information data received from the current transformers.

According to an embodiment of the present invention, one (master MCMU) of the plurality of MCMUs may be preferably connected to the smart meter through a first terminal.

According to an embodiment of the present invention, the master MCMU may be preferably connected to the rest MCMUs (slave MCMUs) of the plurality of MCMUs through second terminals.

According to an embodiment of the present invention, the MCMU may include a controller configured to analyze the power information data received from the current transformers, and to record a leakage current event in the occurrence of a leakage current; and a storage unit configured to store the leakage current event under control of the controller.

According to an embodiment of the present invention, the MCMU may preferably further include an analogue-digital converter (ADC) configured to convert the analogue power information data received from the current transformers, into digital power information data.

According to an embodiment of the present invention, the MCMU may preferably further include a communication unit configured to transmit the leakage current event to the smart meter.

According to an embodiment of the present invention, the controller may preferably determine whether a leakage current has occurred or not, by comparing the power information data received from the current transformers, with a leakage current determination basis with respect to a corresponding channel.

According to an embodiment of the present invention, the leakage current determination basis may be preferably provided from the smart meter.

According to an embodiment of the present invention, the leakage current event may preferably include a leakage current value, a leakage current-occurred time, and a leakage current-occurred channel.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Though terms of 'first', 'second', etc. are used to explain various components, the components are not limited to the terms. The terms are used only to distinguish one component from another component. For example, a first component may be referred to as a second component, or similarly, the second component may be referred to as the first component within the scope of the present invention.

When it is mentioned that one component is "connected" or "accessed" to another component, it may be understood that the one component is directly connected or accessed to said another component or that still other component is interposed between the two components. In the meantime, when it is mentioned that one component is "directly connected" or "directly accessed" to another component, it may be understood that no component is interposed therebetween.

All the terms in the present invention are used to merely explain specific embodiments, but are not used to limit the present invention. A singular expression includes a plural concept unless there is a contextually distinctive difference therebetween. In the present invention, a term of "include" or "have" should not be interpreted as if it absolutely includes a plurality of components or steps of the specification. Rather, the term of "include" or "have" may not include some components or some steps, or may further include additional components.

Hereinafter, a preferred embodiment of the present invention will be explained in more details with reference to the attached drawings.

Figure 1:
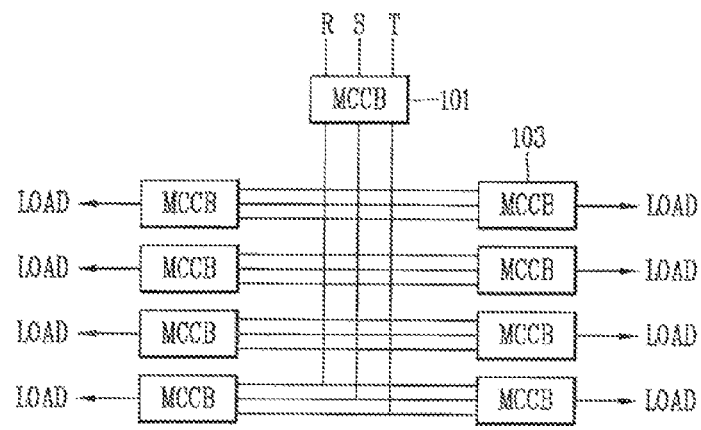
FIG. 1 is a configuration view showing a distribution board system in accordance with the conventional art.
Figure 2:
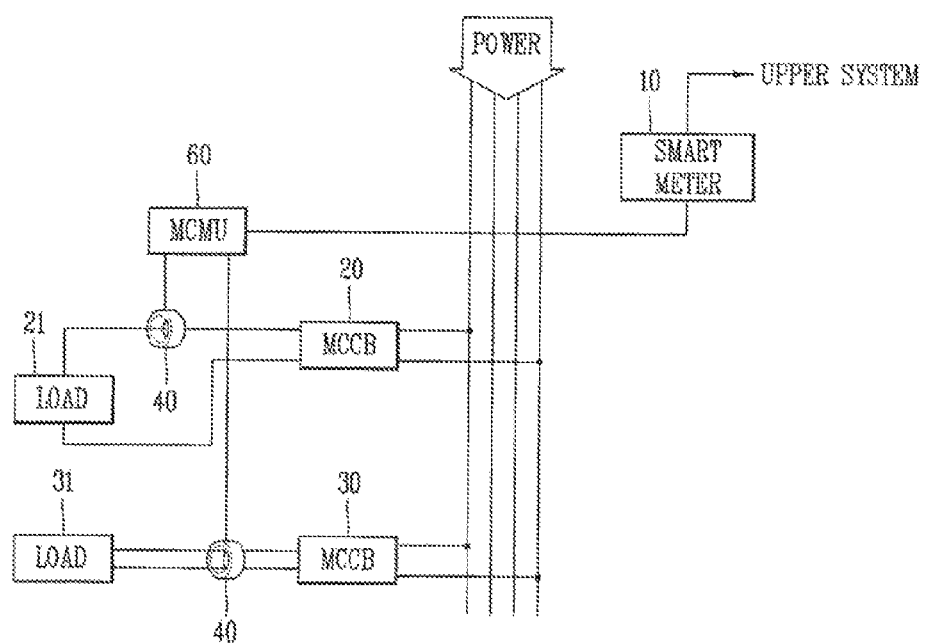
FIG. 2 is a configuration view schematically showing a multi-channel leakage current monitoring system according to an embodiment of the present invention.

FIG. 2 is a configuration view schematically showing a multi-channel leakage current monitoring system according to an embodiment of the present invention.

As shown, the multi-channel leakage current monitoring system according to the present invention comprises a smart meter 10, molded case circuit breakers ('MCCB's) 20 and 30, a current transformer (CT) 40 and a zero current transformer (ZCT) 50 configured to measure leakage currents occurring from power lines, the leakage currents output to loads 21 and 31 connected to the MCCBs, and a multi-channel measuring unit ('MCMU') 60.

For convenience, FIG. 2 illustrates that the CT 40 and the ZCT 50 are connected to the MCMU 60 so that leakage currents are measured on two power lines. However, the present invention is not limited to this. That is, the MCMU 60 may be configured to collect measurement results with respect to leakage currents, from 12 CTs 40 and ZCTs 50, through a plurality of channels (e.g., 12 channels).

FIG. 2 illustrates a single MCMU 60. However, in the present invention, a plurality of MCMUs 60 (e.g., 5 MUMUs) are connected to each other, and are configured to transmit, to the smart meter 10, collected measurement results with respect to leakage currents. This will be explained in more details with reference to the attached drawings.

Referring to FIG. 2, the smart meter 10 is a digital watt-hour meter configured to measure, store and collect various data on power required by an upper system, and to transmit the data to the upper system through a network.

The MCCBs 20 and 30 are configured to open and close power lines which are in a conductive state, which serve to automatically break a current in an abnormal state such as overload and disconnection. The operation of the MCCBs 20 and 30 are well-known to those skilled in the art, and thus its detailed explanations will be omitted.

The CT 40 and the ZCT 50 are connected to power lines connected to the loads 21 and 31 from the MCCBs 20 and 30. In FIG. 2, the CT 40 is connected to the MCCB 20 and the ZCT 50 is connected to the MCCB 30. However, the present invention is not limited to this. That is, only one of the CT 40 and the ZCT 50, or both of them may be used for measurements of leakage currents between the MCCBs 20 and 30 and the loads 21 and 31.

The CT 40 for converting a large current value into a small current value, real-time detects power information data, such as a current, valid/invalid power and valid/invalid energy, each used by the load 21 connected to a secondary side power line of the MCCB 20. Then, the CT 40 transmits the measured power information data to the MCMU 60. The ZCT 50 for detecting a zero-phase current, also real-time detects power information data, such as a current, valid/invalid power and valid/invalid energy, each used by the load 31 connected to a secondary side power line of the MCCB 30. Then, the ZCT 50 transmits the measured power information data to the MCMU 60, like the CT 40. The operations of the CT 40 and the ZCT 50 have been already well-known, and thus detailed explanations thereof will be omitted.

The MCMU 60 serving as a sub-unit, is configured to receive data output from the CT 40 and the ZCT 50. Then, the MCMU 60 analyzes the received data to detect a leakage current, and transmits the leakage current to the smart meter 10.

Figure 3:
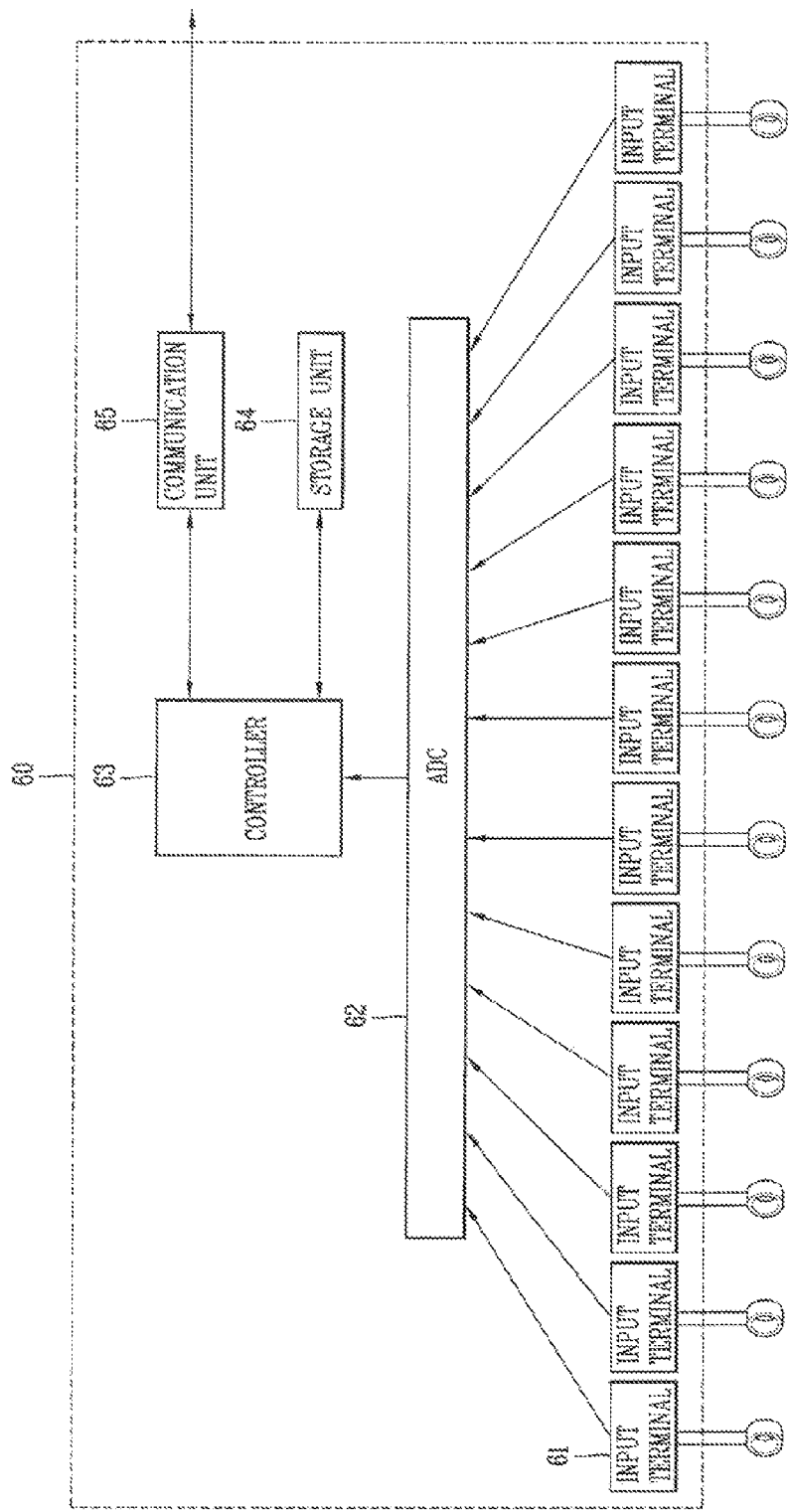
FIG. 3 is a detailed configuration view of a multi-channel measuring unit (MCMU) of FIG. 2 according to an embodiment.

FIG. 3 is a detailed configuration view of the MCMU of FIG. 2 according to one embodiment.

As shown, the MCMU 60 is provided with a plurality of (e.g., 12) input terminals 61, and is connected to the CT 40 or the ZCT 50 thus to receive data from the CT 40 or the ZCT 50. And, the MCMU 60 includes an analog-digital converter (ADC) 62, a controller 53, a storage unit 64 and a communication unit 65.

In FIG. 3, the number of the input terminals 61 is 12. However, the present invention is not limited to this. That is, the input terminals 61 are connected to the CT 40 or the ZCT 50, and receive power information data from the CT 40 or the ZCT 50. Here, the power information data includes a current, valid/invalid power and valid/invalid energy each used by loads, and a leakage current. The MCMU 60 is implemented as a 'multi-channel', since it receives data from each of the plurality of input terminals 61.

The ADC 62 converts analogue data received from the plurality of input terminals 61, into digital data. The controller 63 real-time receives power information data from the CT 40 or the ZCT 50, and compares the received data with a leakage current determination basis with respect to each load. If a leakage current has occurred, the ADC 62 records a leakage current event of a channel corresponding to a load, and stores the recorded leakage current event in the storage unit 64.

The leakage current event includes a leakage current value, a leakage current-occurred time, and a leakage current-occurred channel.

To this end, the controller 63 may receive in advance, a leakage current determination basis per channel, the determination basis provided from the smart meter 10 through the communication unit 65. If the leakage current determination basis per channel is small, even a small leakage current can be detected.

The communication unit 65 performs communication with the smart meter 10 under control of the controller 63, and transmits a leakage current event to the smart meter 10. The communication unit 65 and the smart meter 10 perform communication using a predetermined serial communication protocol. Preferably, the predetermined serial communication protocol is RS-485. The RS-485 is a communication protocol through which all connected devices can transmit and receive data on the same line. However, the present invention is not limited to this. That is, data transmission and data reception may be performed through other type of communication protocol.

In the present invention, the MCMU 60 serving as a sub-unit may be implemented as a plurality of MCMUs 60 connected to one another. As a result, the MCMU 60 may be extended to multi channels whose number is greater than that of multi channels by the plurality of input terminals 61.

Figure 4:
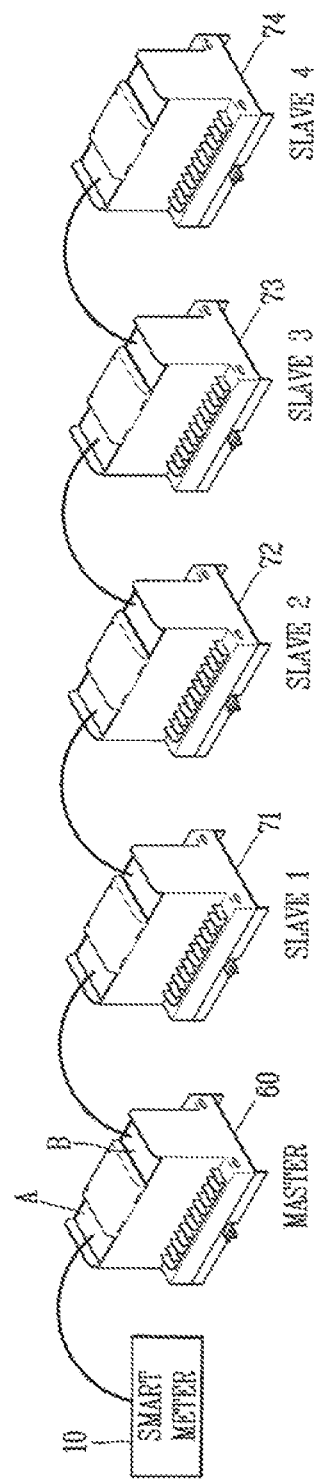
FIG. 4 is an exemplary view showing the extension of the MCMU according to the present invention.

FIG. 4 is an exemplary view showing the extension of the MCMU according to the present invention.

As shown, the smart meter 10 is connected to a plurality of MCMUs 60 and 71~74. Here, the MCMU directly connected to the smart meter 10 is called a master MCMU 60, and other MCMUs connected to the mater MCMU 60 are called slave MCMUs 71~74. However, such a categorization is performed for convenience. The configuration of the slave MCMUs 71~74 is the same as that of the MCMU of FIG. 3, except that the communication unit 65 is not directly connected to the smart meter 10, and the MCMUs are connected to each other. That is, the communication unit 65 does not directly transmit a leakage current event to the smart meter 10, but transmits to the slave MCMU disposed adjacent thereto. Then, the communication unit 65 finally transmits the leakage current event to the master MCMU 60, so that the master MCMU 60 can transmit the leakage current event to the smart meter 10.

The smart meter 10, the mater MCMU 60 and the slave MCMUs 71~74 may perform communication using a predetermined serial communication protocol, and the serial communication protocol is preferably RS-485 as aforementioned.

The smart meter 10 is connected to the master MCMU 60 through a main terminal (A) of the master MCMU 60. In the drawings, the smart meter 10 and the master MCMU 20 are directly connected to each other. However, the present invention is not limited to this. That is, other device (not shown) may be installed in the middle of the communication line.

The master MCMU 60 and the slave MCMU1 71 are connected to each other through a sub terminal (B) of the master MCMU 60, and a sub terminal of the slave MCMU1 71. The slave MCMU1 71 and the slave MCMU2 72 are connected to each other through sub terminals thereof. In such a manner, the master MCMU 60 is connected up to the slave MCMU4 74.

In the present invention, the smart meter 10 is connected to 5 MCMUs including the master MCMU 60 and the 4 slave MCMUs. However, it is obvious to those skilled in the art that the present invention is not limited to this.

Figure 5:
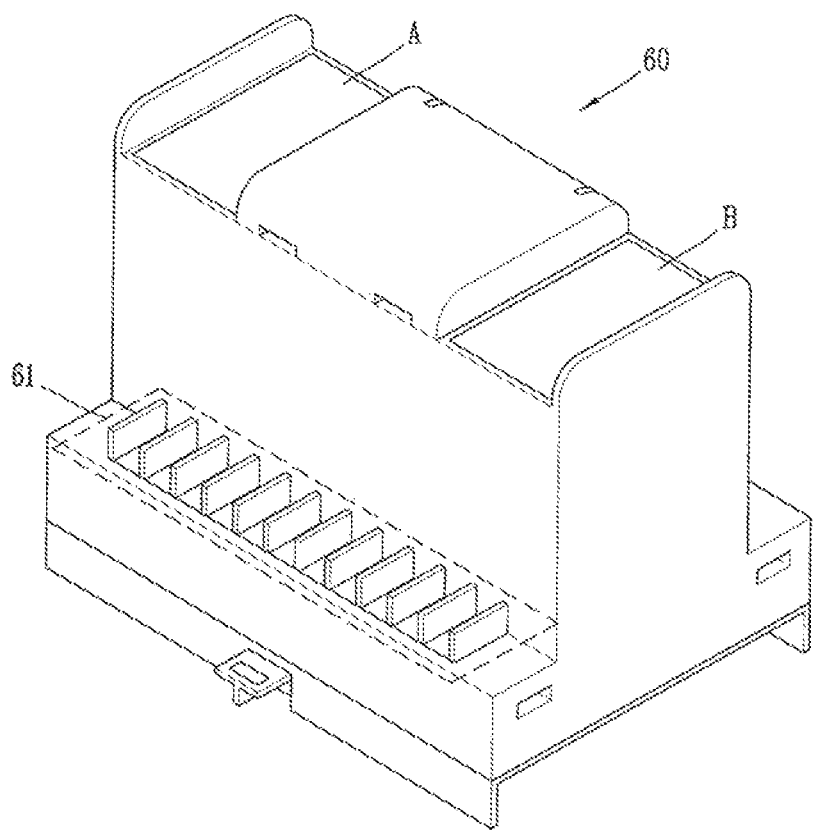
FIG. 5 is an exemplary view for explaining the appearance of the MCMU according to the present invention.

FIG. 5 is an exemplary view for explaining the appearance of the MCMU 60 of FIG. 4 according to the present invention. Here, the slave MCMUs 71~74 have the same appearance as the master MCMU 60. For convenience, the master MCMU 60 will be referred to as 'MCMU' 60.

As shown, the MCMU 60 of the present invention includes a main terminal A, a sub terminal B, and a plurality of input terminals 61.

The MCMU 60 is connected to the smart meter 10 through a main terminal A, and transmits and receives information to/from the smart meter 10. And, the MCMU 60 transmits and receives information to/from the slave MCMU1 71 through a sub terminal B. As aforementioned, the slave MCMUs 71~74 transmits and receives information to/from each other, through the sub terminal B.

As aforementioned, the input terminals 61 of the MCMU 60 are connected to the CT 40 or the ZCT 50 thus to receive data from the CT 40 or the ZCT 50.

As the plurality of MCMUs 60 and 71~74 are connected to one another and each of them transmits or receives data with the smart meter 10, the smart meter 10 can receive power information data of multi channels.

As aforementioned, in the present invention, leakage currents of multi channels are simultaneously monitored, at power output points of a distribution board. Under such a configuration, the size of the system can be reduced, the system can be easily installed at the existing distribution board, and the number of required communication lines can be minimized. Furthermore, since a leakage current is determined based on a leakage current determination basis provided from the smart meter 10, even a small leakage current can be detected. Besides, in the occurrence of a leakage current, a leakage current event including a leakage current value, a leakage current-occurred time and a leakage current-occurred channel, is transmitted to the smart meter. This can allow the leakage current event to be effectively analyzed and later-processed.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A multi-channel leakage current monitoring system configured to monitor leakage currents transmitted to loads from a plurality of molded case circuit breakers (MCCBs), the system comprising:

a plurality of current transformers configured to measure power information data about loads connected to secondary side power lines of the MCCBs, and to provide the measured data;

a multi-channel measuring unit (MCMU) configured to detect a leakage current by analyzing the power information data received from the current transformers, and having a controller configured to analyze the measured data received from the plurality of current transformers, to record a leakage current event in an occurrence of a leakage current, and to transmit data of the leakage current to the smart meter; and a smart meter configured to measure, store, and collect data of power required by an upper system of the multi-channel monitoring system by receiving the transmitted data from the MCMU.

2. The system of claim 1, wherein one of the plurality of MCMUs is connected to the smart meter through a first terminal.

3. The system of claim 2, wherein the one of the plurality of MCMUs is connected to remaining ones of the plurality of MCMUs through a second terminal.

4. The system of claim 1, wherein the MCMU includes:
a storage unit configured to store the leakage current event under control of the controller.

5. The system of claim 1, wherein the MCMU further includes:
an analog-digital converter (ADC) configured to convert the measured data received from the current transformers into digital power information data.

6. The system of claim 3, wherein the MCMU further includes:
a communication unit configured to transmit the leakage current event to the smart meter.

7. The system of claim 4, wherein the controller determines whether a leakage current has occurred or not, by comparing the power information data received from the current transformers, with a leakage current determination basis of a corresponding channel.

8. The system of claim 7, wherein the leakage current determination basis is provided from the smart meter.

9. The system of claim 4, wherein the leakage current event includes a leakage current value, a leakage current-occurred time, and a leakage current-occurred channel.

* * * * *